(12) United States Patent
Kim

(10) Patent No.: US 9,055,143 B2
(45) Date of Patent: Jun. 9, 2015

(54) MOBILE TERMINAL

(75) Inventor: Dongok Kim, Gyeonggi-Do (KR)

(73) Assignee: LG ELECTRONICS INC., Seoul (KR)

( * ) Notice: Subject to any disclaimer, the term of this patent is extended or adjusted under 35 U.S.C. 154(b) by 762 days.

(21) Appl. No.: 13/274,143

(22) Filed: Oct. 14, 2011

(65) Prior Publication Data

US 2012/0121117 A1    May 17, 2012

(30) Foreign Application Priority Data

Nov. 11, 2010  (KR) .................. 10-2010-0112320

(51) Int. Cl.
| H04R 1/02 | (2006.01) |
| H04M 1/03 | (2006.01) |
| H04M 1/02 | (2006.01) |
| H05K 3/32 | (2006.01) |
| H05K 3/40 | (2006.01) |

(52) U.S. Cl.
CPC ........ *H04M 1/03* (2013.01); *H04M 1/02* (2013.01); *H04R 2499/11* (2013.01); *H04M 1/026* (2013.01); *H05K 3/326* (2013.01); *H05K 3/4015* (2013.01); *H05K 2201/10083* (2013.01)

(58) Field of Classification Search
CPC ......... H04M 1/026; H04M 1/03; H04M 1/02; H04R 9/046; H04R 9/06; H04R 1/06; H04R 13/02; H04R 2400/03; H04R 2499/11
USPC ......... 381/334, 365, 386, 394, 396, 397, 409, 381/410; 379/430, 433.01, 433.02, 433.05, 379/432, 438
See application file for complete search history.

(56) References Cited

U.S. PATENT DOCUMENTS

| 5,836,790 | A | 11/1998 | Barnett | |
| 6,128,385 | A * | 10/2000 | Goyal et al. | ............. 379/433.01 |
| 6,577,743 | B2 * | 6/2003 | Masuda et al. | ................ 381/409 |
| 7,362,877 | B2 * | 4/2008 | Honda et al. | .................. 381/409 |
| 7,421,088 | B2 | 9/2008 | Cranfill et al. | |
| 2005/0047621 | A1 | 3/2005 | Cranfill et al. | |
| 2008/0291647 | A1 | 11/2008 | Hirota et al. | |

FOREIGN PATENT DOCUMENTS

CN   101321200 A   12/2008

* cited by examiner

*Primary Examiner* — Huyen D Le
(74) *Attorney, Agent, or Firm* — Birch, Stewart, Kolasch & Birch, LLP

(57) ABSTRACT

A mobile terminal is provided. The mobile terminal includes a case defining a body of the mobile terminal, a circuit board located in the body, an electronic device located in the body, a mounting portion formed at the case so as to mount the electronic device to the case, and a connection terminal provided at the circuit board, the connection terminal providing an elastic contact between the circuit board and the electronic device, the electronic device being electrically connected to the circuit board via the connection terminal.

17 Claims, 7 Drawing Sheets

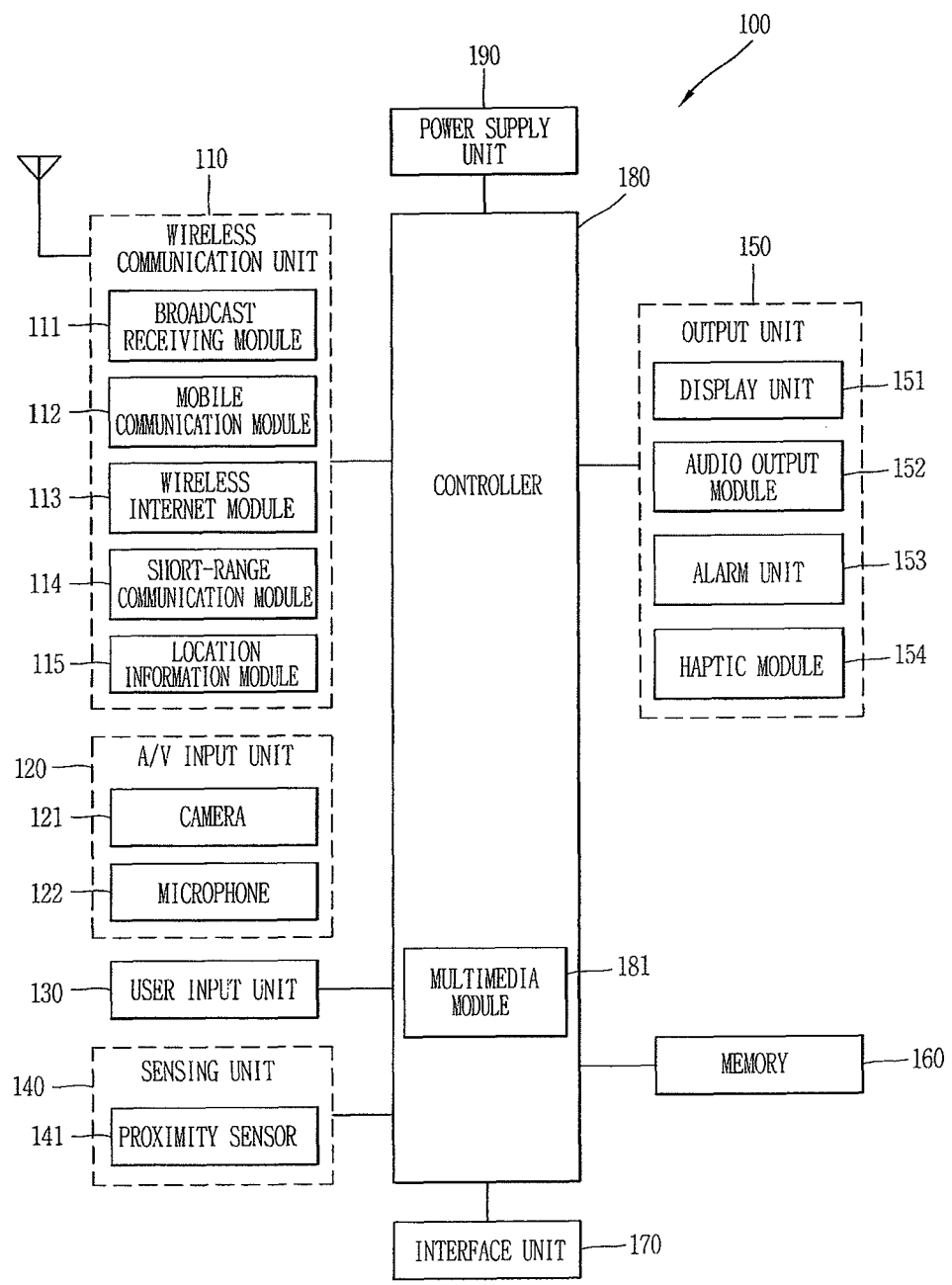

MOBILE TERMINAL

CROSS-REFERENCE TO RELATED APPLICATIONS

Pursuant to 35 U.S.C. §119(a), this application claims the benefit of earlier filing date and right of priority to Korean Application No. 10-2010-0112320, filed on Nov. 11, 2010, the contents of which is incorporated by reference herein in its entirety.

BACKGROUND OF THE DISCLOSURE

1. Field of the Disclosure

The present disclosure relates to a mobile terminal, and particularly, to a mobile terminal having a circuit board for power supply and an electronic device controlled by the circuit board.

2. Description of Related Art

In general, a terminal may be classified into a mobile (portable) terminal and a stationary terminal according to a moveable state. The mobile terminal may be also classified into a handheld terminal and a vehicle mount terminal.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

Various attempts have been made to implement complicated functions in such a multimedia device by means of hardware or software. For example, a User Interface (UI) environment is provided in a mobile terminal to enable a user to easily and conveniently search for or select a desired function among available function.

As the mobile terminal is regarded as personal belongings reflective of a user's personality, various designs are required. The various designs include structural changes and improvements to enhance the user's convenience.

For the structural changes and improvements, electric connection between an electronic device and a circuit board, or a mechanism for mounting the electronic device, etc. may be considered.

BRIEF SUMMARY OF THE DISCLOSURE

Therefore, an object of the present disclosure is to provide a mobile terminal capable of electrically connecting an electronic device and a circuit board to each other for enhanced reliability.

Another object of the present disclosure is to provide a mobile terminal capable of having a compact configuration.

To achieve these and other advantages and in accordance with the purpose of the present disclosure, as embodied and broadly described herein, there is provided a mobile terminal having a case defining a body of the mobile terminal, a circuit board located in the body, an electronic device located in the body, a mounting portion formed at the case so as to mount the electronic device to the case, and a connection terminal provided at the circuit board, the connection terminal providing an elastic contact between the circuit board and the electronic device, the electronic device being electrically connected to the circuit board via the connection terminal.

According to another aspect of the present disclosure, there is provided a mobile terminal a case defining a body of the mobile terminal, a circuit board located in the body, an electronic device located in the body, the electronic device being spaced from the circuit board, a mounting portion integrally formed with the case, the mounting portion surrounding the electronic device such that the electronic device is fixed to the case, and a connection terminal surface-mounted on the circuit board and extending toward the electronic device so as to contact the electronic device.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the disclosure and are incorporated in and constitute a part of this specification, illustrate exemplary embodiments of the disclosure and together with the description serve to explain the principles of the disclosure.

In the drawings:

FIG. 1 is a block diagram of a mobile terminal according to one exemplary embodiment of the present disclosure;

DETAILED DESCRIPTION OF THE DISCLOSURE

Figure 2A:
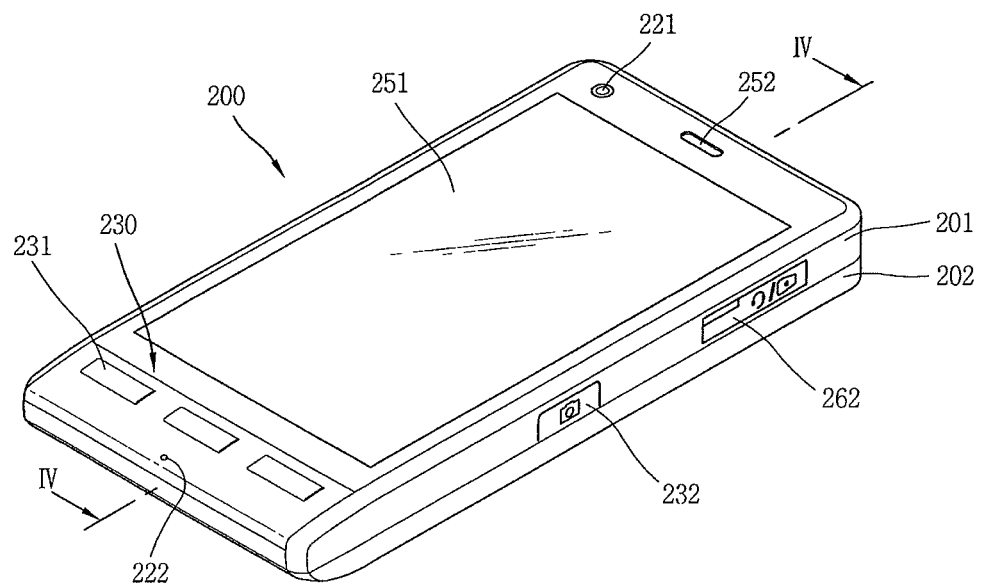
FIG. 2A is a front perspective view of the mobile terminal according to another exemplary embodiment of the present disclosure.

Description will now be given in detail of various exemplary embodiments of the present disclosure with reference to the accompanying drawings. For the sake of brief description with reference to the drawings, the same or equivalent components will be provided with the same reference numbers, and description thereof will not be repeated.

Hereinafter, a mobile terminal according to the present disclosure will be explained in more detail with reference to the attached drawings The suffixes attached to components of the mobile terminal, such as 'module' and 'unit or portion' were used for facilitation of the detailed description of the present disclosure. Therefore, the suffixes do not have different meanings from each other. The mobile terminal according to the present disclosure may include a portable phone, a smart phone, a laptop computer, a digital broadcasting terminal, Personal Digital Assistants (PDA), Portable Multimedia Player (PMP), a navigation system, etc.

FIG. 1 is a block diagram of a mobile terminal according to one exemplary embodiment of the present disclosure.

The mobile terminal 100 may comprise components, such as a wireless communication unit 110, an Audio/Video (A/V) input unit 120, a user input unit 130, a sensing unit 140, an output module 150, a memory 161, an interface unit 162, a controller 170, a power supply unit 163 and the like. FIG. 1 shows the mobile terminal 100 having various components, but it is understood that implementing all of the illustrated components is not a requirement. Greater or fewer components may alternatively be implemented.

The wireless communication unit 110 may typically include one or more components which permit wireless communications between the mobile terminal 100 and a wireless communication system or between the mobile terminal 100 and a network within which the mobile terminal 100 is located. For example, the wireless communication unit 110 may include a broadcast receiving module 111, a mobile communication module 112, a wireless internet module 113, a short-range communication module 114, a position information module 115 and the like.

The broadcast receiving module 111 receives a broadcast signal and/or broadcast associated information from an external broadcast managing entity via a broadcast channel. The broadcast channel may include a satellite channel and a terrestrial channel. The broadcast managing entity may indicate a server which generates and transmits a broadcast signal and/or broadcast associated information or a server which receives a pre-generated broadcast signal and/or broadcast associated information and sends them to the mobile terminal. The broadcast signal may be implemented as a TV broadcast signal, a radio broadcast signal, and a data broadcast signal, among others. The broadcast signal may further include a data broadcast signal combined with a TV or radio broadcast signal.

The broadcast associated information may indicate information relating to broadcast channels, broadcast programs or broadcast service providers. Further, the broadcast associated information may be provided via a mobile communication network and received by the mobile communication module 112. The broadcast associated information may be implemented in various formats. For example, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module 111 may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T), and the like. The broadcast receiving module 111 may be configured to be suitable for every broadcast system transmitting broadcast signals as well as the digital broadcasting systems.

Broadcast signals and/or broadcast associated information received via the broadcast receiving module 111 may be stored in a suitable device, such as a memory 161.

The mobile communication module 112 transmits/receives wireless signals to/from at least one of network entities (e.g., base station, an external terminal, a server, etc.) on a mobile communication network. Here, the wireless signals may include audio call signal, video call signal, or various formats of data according to transmission/reception of text/multimedia messages.

The wireless internet module 113 supports wireless Internet access for the mobile terminal. This module may be internally or externally coupled to the mobile terminal 100. Examples of such wireless Internet access may include Wireless LAN (WLAN) (Wi-Fi), Wireless Broadband (Wibro), World Interoperability for Microwave Access (Wimax), High Speed Downlink Packet Access (HSDPA), and the like.

The short-range communication module 114 denotes a module for short-range communications. Suitable technologies for implementing this module may include BLUETOOTH, Radio Frequency IDentification (RFID), Infrared Data Association (IrDA), Ultra-WideBand (UWB), ZigBee, and the like.

The position information module 115 denotes a module for detecting or calculating a position of a mobile terminal. An example of the position information module 115 may include a Global Position System (GPS) module.

The A/V input unit 120 is configured to provide audio or video signal input to the mobile terminal. The A/V input unit 120 may include a camera 121 and a microphone 122. The camera 121 receives and processes image frames of still pictures or video obtained by image sensors in a video (telephony) call mode or a capturing mode. The processed image frames may be displayed on a display unit 151.

The image frames processed by the camera 121 may be stored in the memory 161 or transmitted to the exterior via the wireless communication unit 110. Two or more cameras 121 may be provided according to the use environment of the mobile terminal.

The microphone 122 may receive an external audio signal while the mobile terminal is in a particular mode, such as a phone call mode, a recording mode, a voice recognition mode, or the like. This audio signal is processed into digital data. The processed digital data is converted for output into a format transmittable to a mobile communication base station via the mobile communication module 112 in case of the phone call mode. The microphone 122 may include assorted noise removing algorithms to remove noise generated in the course of receiving the external audio signal.

The user input unit 130 may generate input data input by a user to control the operation of the mobile terminal. The user input unit 130 may include a keypad, a dome switch, a touchpad (e.g., static pressure/capacitance), a jog wheel, a jog switch and the like. When the touch pad has a layered structure with a display unit 151 to be later explained, this may be referred to as a 'touch screen'.

The sensing unit 140 provides status measurements of various aspects of the mobile terminal. For example, the sensing unit 140 may detect an open/close status of the mobile terminal, a change in a location of the mobile terminal 100, a presence or absence of user contact with the mobile terminal 100, the orientation of the mobile terminal 100, acceleration/deceleration of the mobile terminal 100, and the like, so as to generate a sensing signal for controlling the operation of the mobile terminal 100. For example, regarding a slide-type mobile terminal, the sensing unit 140 may sense whether a sliding portion of the mobile terminal is open or closed. Other examples include sensing functions, such as the sensing unit 140 sensing the presence or absence of power provided by the power supply 163, the presence or absence of a coupling or other connection between the interface unit 162 and an external device and the like. Moreover, the sensing unit 140 may include a proximity sensor 141, which will be later explained in relation to a touch screen.

The output unit 150 is configured to output an audio signal, a video signal or an alarm signal. The output unit 150 may include a display unit 151, an audio output module 152, an alarm 153, a haptic module 154, and the like.

The display unit 151 may output information processed in the mobile terminal 100. For example, when the mobile terminal is operating in a phone call mode, the display unit 151 will provide a User Interface (UI) or a Graphic User Interface (GUI) which includes information associated with the call. As another example, if the mobile terminal is in a video call mode or a capturing mode, the display unit 151 may additionally or alternatively display images captured and/or received, UI, or GUI.

The display unit 151 may include at least one of a Liquid Crystal Display (LCD), a Thin Film Transistor-Liquid Crystal Display (TFT-LCD), an Organic Light-Emitting Diode (OLED), a flexible display and a three-dimensional (3D) display.

Some of the displays can be configured to be transparent such that it is possible to see the exterior therethrough. These displays may be called transparent displays. A representative example of the transparent display may include a Transparent Organic Light Emitting Diode (TOLED), and the like. The rear surface portion of the display unit 151 may also be implemented to be optically transparent. Under this configuration, a user can view an object positioned at a rear side of a body through a region occupied by the display unit 151 of the body.

The display unit 151 may be implemented in two or more in number according to a configured aspect of the mobile terminal 100. For example, a plurality of displays may be arranged on one surface integrally or separately, or may be arranged on different surfaces.

Here, if the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touch pad, and the like.

The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also a touch pressure.

When touch inputs are sensed by the touch sensors, corresponding signals are transmitted to a touch controller (not shown). The touch controller processes the received signals, and then transmits corresponding data to the controller 170. Accordingly, the controller 170 may sense which region of the display unit 151 has been touched.

Referring to FIG. 1, a proximity sensor 141 may be arranged at an inner region of the mobile terminal covered by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Accordingly, if the pointer is in proximity to the touch screen without contacting the touch screen, the position of the pointer and a distance between the pointer and the touch screen may be detected. Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may output audio data received from the wireless communication unit 110 or stored in the memory 161, in a call-receiving mode, a call-placing mode, a recording mode, a voice recognition mode, a broadcast reception mode, and so on. The audio output module 152 may output audio signals relating to functions performed in the mobile terminal 100, e.g., sound alarming a call received or a message received, and so on. The audio output module 152 may include a receiver, a speaker, a buzzer, and so on.

The alarm 153 outputs signals notifying occurrence of events from the mobile terminal 100. The events occurring from the mobile terminal 100 may include call received, message received, key signal input, touch input, and so on. The alarm 153 may output not only video or audio signals, but also other types of signals such as signals notifying occurrence of events in a vibration manner. For example, the alarm 153 may be configured to vibrate responsive to the mobile terminal receiving a call or message. As another example, when a key signal has been inputted, the alarm 153 may output vibration as a feedback of the key signal input. Through this vibration output, a user may recognize the occurrence of an event. In order to output a signal in a vibration manner, the mobile terminal may be mounted with a vibrator. Here, the video signal or audio signal may be outputted through the display unit 151 or the audio output module 152.

The haptic module 154 generates various tactile effects which a user can feel. A representative example of the tactile effects generated by the haptic module 154 includes vibration. Vibration generated by the haptic module 164 may have a controllable intensity, a controllable pattern, and so on. For example, different vibration may be output in a synthesized manner or in a sequential manner.

The haptic module 154 may generate various tactile effects, including not only vibration, but also arrangement of pins vertically moving with respect to a skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects (signals) through a user's direct contact, or a user's muscular sense using a finger or a hand. The haptic module 154 may be implemented in two or more in number according to the configuration of the mobile terminal 100.

The memory 161 may store a program for the processing and control of the controller 170. Alternatively, the memory 161 may temporarily store input/output data (e.g., phonebook data, messages, still images, video and the like). Also, the memory 161 may store data relating to various patterns of vibrations and audio output upon the touch input on the touch screen.

The memory 161 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-only Memory (EEPROM), Programmable Read-only Memory (PROM), magnetic memory, magnetic disk, optical disk, and the like. Also, the mobile terminal 100 may operate a web storage which performs the storage function of the memory 161 on the Internet.

The interface unit 162 may generally be implemented to interface the mobile terminal with external devices. The interface unit 162 may allow a data reception from an external device, a power delivery to each component in the mobile terminal 100, or a data transmission from the mobile terminal 100 to an external device. The interface unit 162 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the mobile terminal 100, which may include a User Identity Module (UIM), a Subscriber Identity Module (SIM), a Universal Subscriber Identity Module (USIM), and the like. Also, the device having the identification module (hereinafter, referred to as 'identification device') may be implemented in a type of smart card. Hence, the identification device can be coupled to the mobile terminal 100 via a port.

Also, the interface unit 162 may serve as a path for power to be supplied from an external cradle to the mobile terminal 100 when the mobile terminal 100 is connected to the external cradle or as a path for transferring various command signals inputted from the cradle by a user to the mobile terminal 100. Such various command signals or power inputted from the cradle may operate as signals for recognizing that the mobile terminal 100 has accurately been mounted to the cradle.

The controller 170 typically controls the overall operations of the mobile terminal 100. For example, the controller 170 performs the control and processing associated with telephony calls, data communications, video calls, and the like. The controller 170 may include a multimedia module 171 which provides multimedia playback. The multimedia module 171 may be configured as part of the controller 170 or as a separate component.

The controller 170 can perform a pattern recognition processing so as to recognize writing or drawing input on the touch screen as text or image.

The power supply unit 163 provides power required by various components under the control of the controller 170. The provided power may be internal power, external power, or combination thereof.

Various exemplary embodiments described herein may be implemented in a computer-readable medium using, for example, software, hardware, or some combination thereof.

For a hardware implementation, the exemplary embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, micro processors, other electronic units designed to perform the functions described herein, or a selective combination thereof. In some cases, such exemplary embodiments are implemented by the controller 170.

For software implementation, the exemplary embodiments such as procedures and functions may be implemented together with separate software modules each of which performs at least one of functions and operations. The software codes can be implemented with a software application written in any suitable programming language. Also, the software codes may be stored in the memory 161 and executed by the controller 170.

Figure 2B:
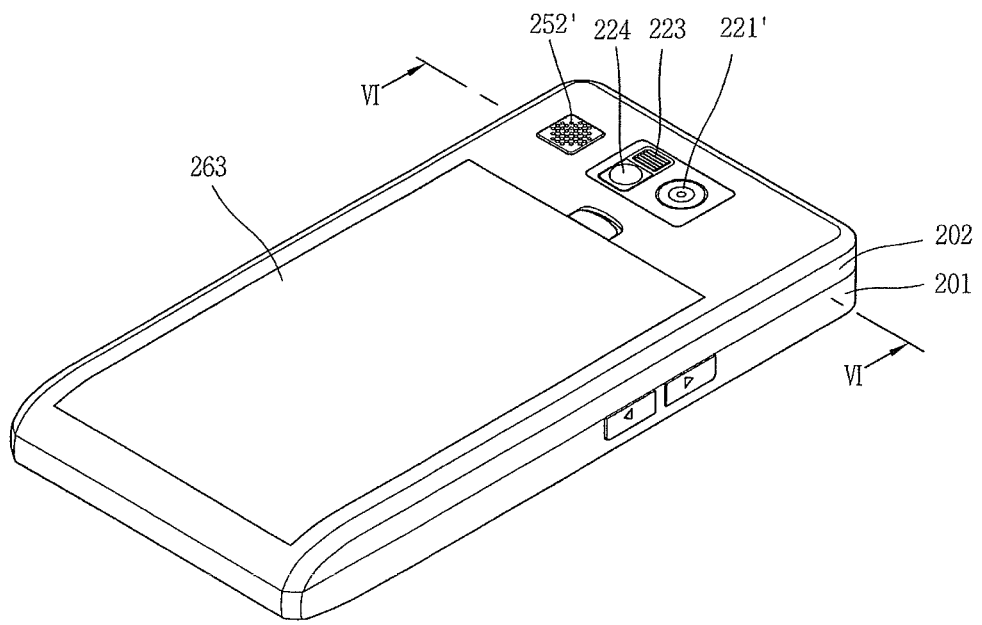
FIG. 2B is a rear perspective view of the mobile terminal of FIG. 2A.

FIG. 2A is a front perspective view of a mobile terminal in accordance with the present disclosure, and FIG. 2B is a rear perspective view of the mobile terminal of FIG. 2A.

As shown in FIGS. 2A and 2B, the mobile terminal 200 is a bar type mobile terminal. However, the present disclosure is not limited to this, but may be applied to a slide type in which two or more bodies are coupled to each other so as to perform a relative motion, a folder type, or a swing type, a swivel type and the like.

A case (casing, housing, cover, etc.) forming an outer appearance of a body may include a front case 201 and a rear case 202. A space formed by the front case 201 and the rear case 202 may accommodate various components therein. At least one intermediate case may further be disposed between the front case 201 and the rear case 202. Such cases may be formed by injection-molded synthetic resin, or may be formed using a metallic material such as stainless steel (STS) or titanium (Ti).

A display module 251, an audio output unit 252, a camera 221, user input units 230, 231 and 232, a microphone 222, an interface unit 262, and the like may be disposed at or on the front case 201.

The display module 251 occupies a major portion of a main surface of the front case 201. The audio output unit 252 and the camera 221 are arranged at a region adjacent to one end of the display module 251, and the user input unit 231 and the microphone 222 are arranged at a region adjacent to another end of the display module 251. The user input unit 232, the interface unit 262, and the like may be arranged on side surfaces of the rear case 202.

The user input unit 230 is manipulated to receive a command for controlling the operation of the mobile terminal 200, and may include a plurality of manipulation units 231 and 232. The manipulation units 231 and 232 may be referred to as manipulating portions, and may include any conventional input units that can be manipulated in a tactile manner.

Commands inputted through the first or second user input units 231 and 232 may be variously set. For example, the first manipulation 231 is configured to input commands such as START, END, SCROLL or the like, and the second manipulation unit 232 is configured to input commands for controlling a level of sound outputted from the audio output unit 252, or commands for converting the current mode of the display unit 251 to a touch recognition mode. The display module 251 may form a touch screen together with a touch sensor, and the touch screen may be one example of the user input unit 230.

Referring to FIG. 2B, a camera 221' may be additionally provided on the rear case 202. The camera 221' faces a direction which is opposite to a direction faced by the camera 221

(refer to FIG. 2A), and may have a different number of pixels from those of the camera 221. For example, the camera 221 may operate with relatively lower pixels (lower resolution). Thus, the camera 221 may be useful when a user can capture his face and send it to another party during a video call or the like. On the other hand, the camera 221' may operate with a relatively higher pixels (higher resolution) such that it can be useful for a user to obtain higher quality pictures for later use. The cameras 221 and 221' may be installed at the terminal body so as to rotate or pop-up.

A flash 223 and a mirror 224 may be additionally disposed adjacent to the camera 221'. The flash 223 operates in conjunction with the camera 221' when taking a picture using the camera 221'. The mirror 224 can cooperate with the camera 221' to allow a user to photograph himself in a self-portrait mode.

An audio output unit 252' may be additionally arranged on a rear surface of the terminal body. The audio output unit 252' may cooperate with the audio output unit 252 (refer to FIG. 2A) disposed on a front surface of the terminal body so as to implement a stereo function. Also, the audio output unit 252' may be configured to operate as a speakerphone.

A power supply unit 263 for supplying power to the mobile terminal 200 is mounted to the terminal body. The power supply unit 263 may be mounted in the terminal body or may be configured to detachable from the outside of the terminal body.

The rear case 202 may be further provided with a touch sensor for detecting a touched status. Like the display module 251, the touch sensor may be formed to be transmissive. In this case, when the display module 251 is configured to output visual information from two surfaces thereof, the visual information may be recognized through the touch sensor. The information outputted from the two surfaces may be controlled by the touch sensor. Differently from this, the touch sensor may be further provided with a display, and the touch screen may be arranged at the rear case 202.

The mobile terminal is provided with a mechanism configured to connect electronic devices, such as a microphone 222, a receiver, a speaker and a vibrator for performing each function of the mobile terminal, with a circuit board for an enhanced reliability. This mechanism will be explained in more detail with reference to FIGS. 3 to 9.

Figure 3:
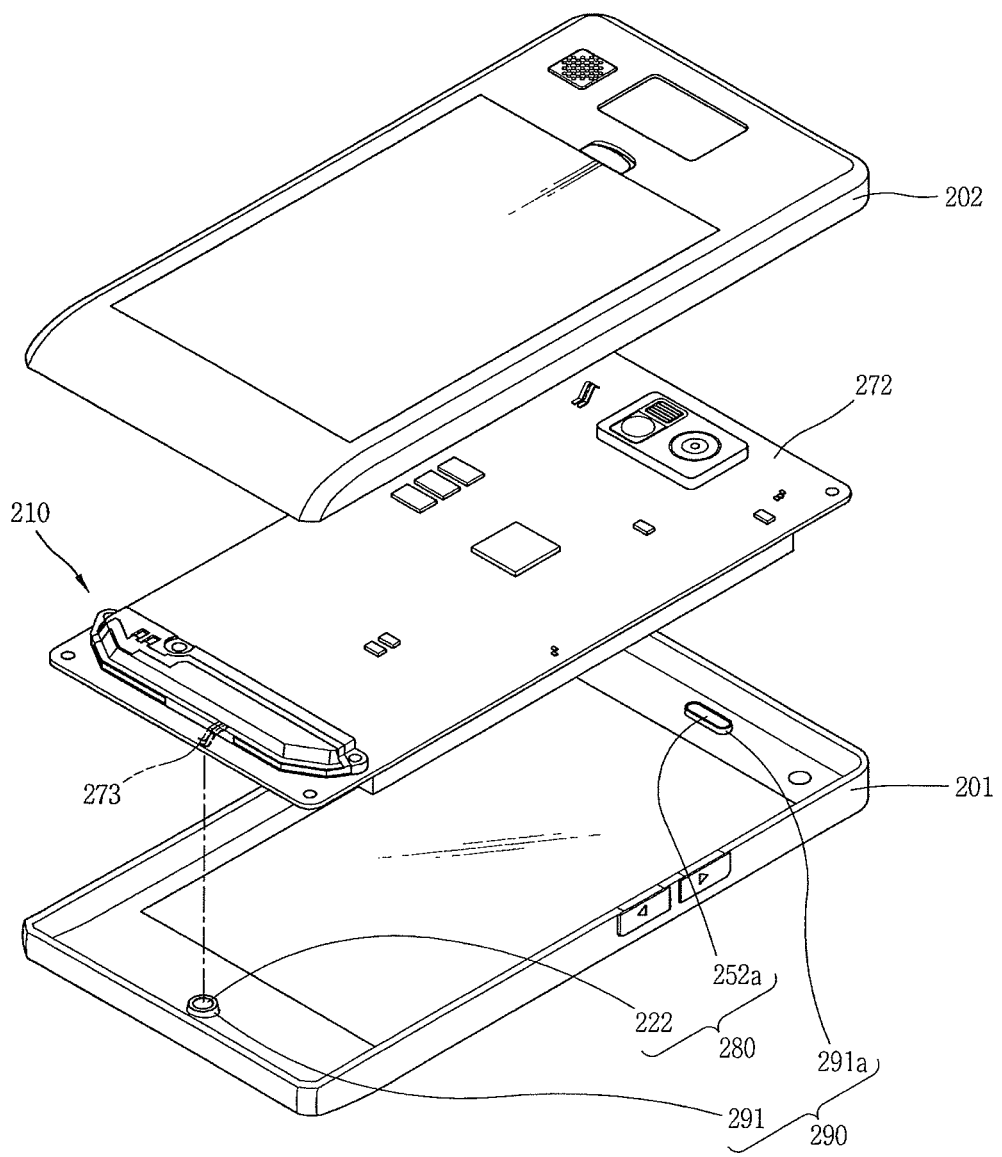
FIG. 3 is an exploded perspective view of the mobile terminal of FIG. 2A.

FIG. 3 is an exploded perspective view of the mobile terminal of FIG. 2A.

Referring to FIG. 3, a circuit board 272 is mounted in a terminal body. The circuit board 272 may be mounted to the front case 201 or the rear case 202, or may be mounted to an additional inner structure.

The circuit board 272 may be implemented to perform the function of the controller 170 (refer to FIG. 1) for operating each function of the mobile terminal. The circuit board 272 may be implemented in plurality in number and may perform a function of the controller 170 by combinations therebetween. In order to perform the function of the controller 170, the circuit board 272 is operably connected to the various electronic devices 280.

The circuit board 272 is electrically connected to an antenna 210, and is configured to process a wireless signal corresponding to a wireless electromagnetic wave transmitted or received by the antenna 210. The antenna 210 is disposed between the rear case 202 and the circuit board 272, and transmits or receives a wireless signal via the rear case 202. The antenna 210 is configured to transmit or receive a wireless signal for wireless communications, Global Positioning Systems (GPS), MediaFLO (Media Forward Link Only), etc., and may serve as a main antenna of the mobile terminal.

A mounting portion 290 is formed at the front case 201 so as to mount the electronic device 280 to the front case 201. The mounting portion 290 may be provided in plural to mount multiple electronic devices 280. For example, a first mounting portion 291 formed adjacent one end of the front case 201 supports the microphone 222 and a second mounting portion 291a formed to be adjacent to another end of the front case 201 supports the receiver 252a. The mounting portion is integrally formed with the front case 201, and is configured to surround the electronic device 280 such that the electronic device 280 is fixed. Under this configuration, the electronic device 280 may be disposed to be spaced from the circuit board 272.

A connection terminal 273 is mounted to the circuit board 272. For example, the connection terminal 273 is surface-mounted to the circuit board 272 and extends toward the electronic device 280 so as to contact the electronic device 280. Once the connection terminal 273 is arranged at a position where the front case 201 and the circuit board 272 are installed, the connection terminal 273 comes in contact with the electronic device to be electrically connected to the electronic device. The connection terminal 273 is elastically deformable and may be implemented as a plate spring, a C clip, or the like.

The electronic device 280 is mounted to the case and receives power from the circuit board 272 by contacting the connection terminal 273. Accordingly, an electric contact part between the electronic device 280 and the connection terminal 273 may not be damaged by an external impact.

Figure 4:
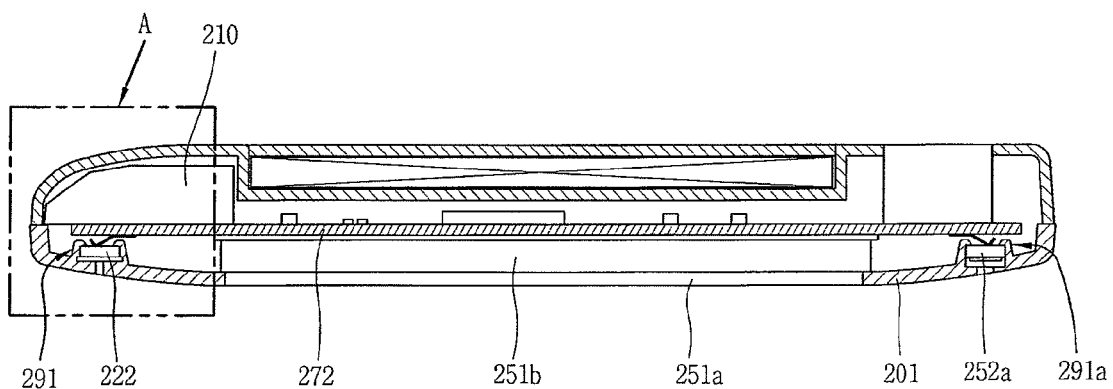
FIG. 4 is a sectional view taken along line 'IV-IV' in FIG. 2A.
Figure 5A:
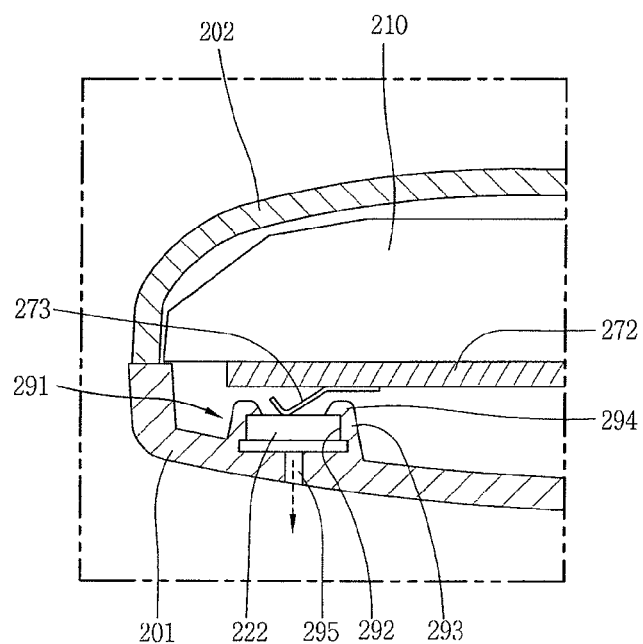
FIG. 5A is an enlargement view of a part 'A' in FIG. 4.
Figure 5B:
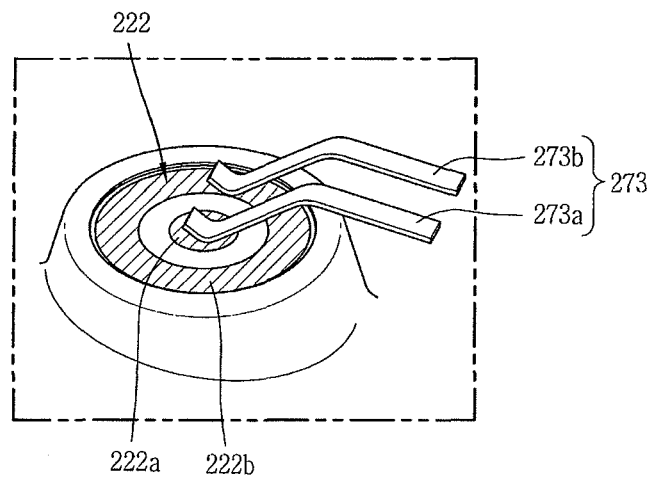
FIG. 5B is a conceptual view showing a contact status between an electronic device and a connection terminal of FIG. 3.

FIG. 4 is a sectional view taken along line 'IV-IV' in FIG. 2A, FIG. 5A is an enlargement view of a part 'A' in FIG. 4, and FIG. 5B is a conceptual view showing a contact status between an electronic device and a connection terminal of FIG. 3.

Referring to FIGS. 4 and 5A, a window 251a is mounted to the front case 201 and a display 251b is mounted to the circuit board 272. The display 251b is arranged at a part covered by the window 251a, and the display 251b and the window 251a may constitute a display module 151 (refer to FIG. 1).

The first and second mounting portions 291 and 291a are formed at both sides of the window 251a, and have similar structures. Hereinafter, the first mounting portion 291 will be explained with reference to FIG. 5A, and the same technical configuration may be applied to the second mounting portion 291a.

The first mounting portion 291 includes an accommodation chamber 292, a protrusion 293, and a cover 294. The accommodation chamber 292 is configured to accommodate therein the electronic device 280 (microphone 222 in the exemplary embodiment) and the protrusion 293 protrudes from the front case 201 and forms a loop so as to define the accommodation chamber 292. For example, the protrusion 293 protrudes from an inner surface of the front case 201 in the form of a ring (closed loop), thereby providing an accommodation space in the accommodation chamber 292.

The cover 294 is formed at one end of the protrusion 293 and is configured to partially overlap the microphone 222 whereby the microphone 222 is fixed to the case 201. For example, the protrusion 293 is integrally formed with the cover 294 and formed of the same material as the cover 294. The microphone 222 is arranged to directly come in contact with a bottom surface of the accommodation chamber 292. For this structure, an insertion-molding (or double molding) of the microphone 222 may be performed to injection-mold the front case 201.

A boundary surface is formed between the first mounting portion 291 and the microphone 222 as a basic material of the front case 201 is solidified after being melted. That is, an empty space is not formed between the first mounting portion 291 and the microphone 222. For example, the microphone 222 is formed of a metallic material, and the front case 201 is formed of a synthetic resin. As the synthetic resin is solidified on an outer surface of the microphone 222, the microphone 222 is integrally coupled to a front inner side of the front case 201.

One or more parts of the front case 201 are formed to have a curved surface, and the microphone 222 is mounted to an inner side of the curved surface. Even if the microphone 222 is mounted at a curved surface, the microphone 222 is arranged in parallel to the circuit board 272. Under this configuration, contact reliability between the connection terminal 273 and the microphone 222 may be enhanced even if the microphone is mounted to an inner side of the curved surface.

A through hole 295 penetrating the front case 201 is formed on a bottom surface of the accommodation chamber 292 such that sound is transmitted therethrough to the microphone. Because the case 201 and the microphone 222 are integrally coupled to each other, and sound is transmitted via the through hole 295, the mobile terminal requires no additional shielding structure for preventing leakage of sound.

Referring to FIGS. 5A and 5B, the electronic device is provided with first and second electrode terminals 222a and 222b and the connection terminal 273 includes first and second connection terminal parts 273a and 273b contacting the first and second electrode terminals 222a and 222b, respectively, so as to supply power to the electronic device. For example, the first electrode terminal 222a is arranged on one surface of the microphone 222, and the second electrode terminal 222b is configured to surround the first electrode terminal 222a. Here, the second electrode terminal 222b may be formed to have a different polarity from the first electrode terminal 222a. More specifically, the first and second electrode terminals 222a and 222b may be a plus (+) electrode terminal and a minus (−) electrode respectively. The first electrode terminal 222a is formed to have a circular shape, and the second electrode terminal 222b is formed to have a ring shape having the first electrode terminal 222a disposed at an intermediate part thereof.

Each of the first and second connection terminal parts 273a and 273b is provided with a fixed end surface-mounted to the circuit board 272 and a free end in elastic contact with the first and second electrode terminals 222a and 222b.

The first and second connection terminal parts 273a and 273b are spaced from each other in a radial direction of the first electrode terminal 222a. That is, the free ends of the first and second connection terminal parts 273a and 273b are spaced from each other in a radial direction of the first electrode terminal 222a, thereby contacting the first and second electrode terminals 222a and 222b, respectively. Under this configuration, even if the connection terminal 273 is rotated in a circumferential direction, a contacted status between the first and second connection terminal parts 273a, 273b and the first and second electrode terminals 222a, 222b can be maintained.

Figure 6:
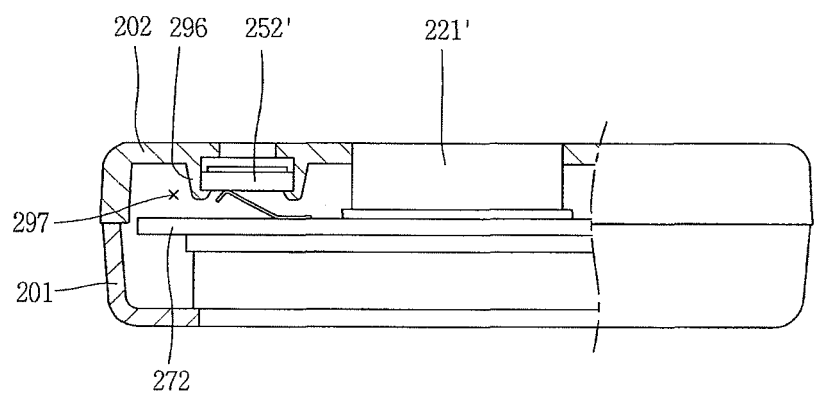
FIG. 6 is a partial sectional view taken along line 'VI-VI' in FIG. 2B.

FIG. 6 is a partial sectional view taken along line 'VI-VI' in FIG. 2B.

Referring to FIG. 6, a speaker 252' is mounted to the rear case 202. In this preferred exemplary embodiment, the electronic device mounted to the rear case 202 is implemented as the speaker 252'; however, it is understood that the present disclosure is not limited to this arrangement. For example, the rear case 202 may be mounted with a microphone, a camera, or the like.

As one example of a mounting portion 290, a third mounting portion 296 is formed at the rear case 202. Between the speaker 252' mounted to the third mounting portion 296 and the circuit board 272 facing the speaker 252', a resonance space 297 is formed by a spacing status between the circuit board 272 and the speaker 252'.

A through hole is formed at the rear case 202 such that a camera 221' is exposed to the outside therethrough, and the third mounting portion 296 is disposed between a side surface of the rear case 202 and the through hole. That is, the side surface of the rear case 202 and the camera 221' are arranged at left and right sides of the third mounting portion 296, respectively, and the circuit board 272 is overlapped with the speaker 252' and the camera 221'. Here, the connection terminal of the circuit board 272 may be implemented as a plate spring, and may contact the speaker 252'.

Back and forth spaces of the third mounting portion 296 may be closed in a similar manner to the right and left arrangements. For example, the third mounting portion 296 may be arranged to be adjacent to a corner of the rear case 202 together with peripheral components such that the resonance space 297 may be formed as a closed space without an additional structure. The resonance space 297 may be formed by combinations between the case and the components, and a function of the speaker inside the compact mobile terminal may be enhanced.

Figure 7:
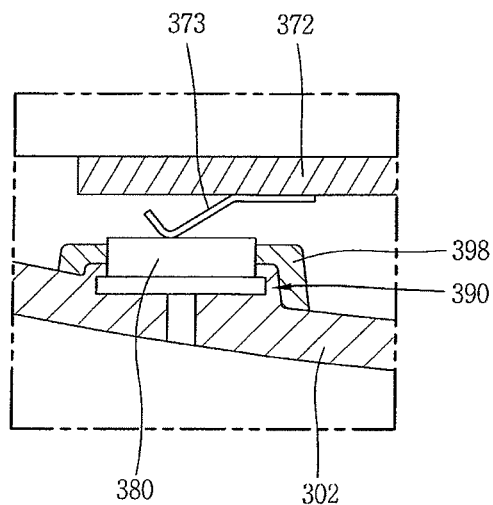
FIG. 7 is a partial sectional view showing a modification example of a mounting portion according to another exemplary embodiment of the present disclosure.

FIG. 7 is a partial sectional view showing a modification example of a mounting portion according to the present disclosure.

Referring to FIG. 7, an impact attenuation member 398 configured to protect the electronic device 380 from an external impact is coupled to a mounting portion 390. The impact attenuation member 398 is formed of a flexible material such as rubber and is configured to surround the mounting portion 390 and the electronic device 380.

For example, a stepped surface is formed on an outer circumferential surface of the electronic device 380 and the mounting portion 390 protrudes from a case 302 so as to cover the stepped surface. The impact attenuation member 398 may be formed in a cylindrical shape having an accommodation space therein so as to surround the mounting portion 390 and cover one or more parts of the electronic device 380. Accordingly, when an external impact is applied to the electronic device 380 in a state that the electronic device 380 is electrically connected to a circuit board 372 through a connection terminal 373, the external impact may be attenuated.

Figure 8:
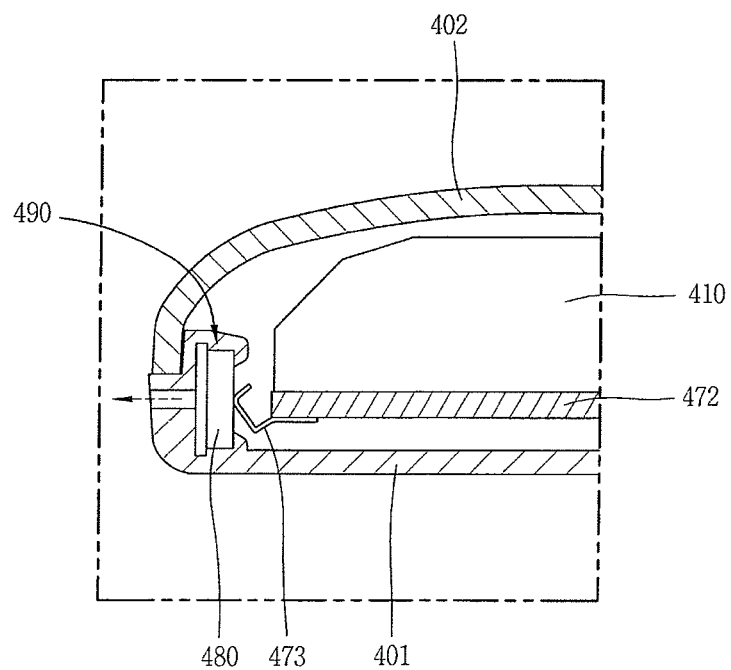
FIG. 8 is a partial sectional view of a mobile terminal according to another exemplary embodiment of the present disclosure.

FIG. 8 is a partial sectional view of a mobile terminal according to another exemplary embodiment of the present disclosure.

Referring to FIG. 8, a mounting portion 490 is formed on an inner side surface of a front case 401. Accordingly, the electronic device 480 may be mounted to an inner side surface of the front case 401. An antenna 410 disposed between a circuit board 472 and a rear case 402 is overlapped with the circuit board 472. However, the electronic device 480 is not overlapped with the circuit board 472. A connection terminal 473 extends from the end of the circuit board 472 toward a side surface of the front case 401. Because of this configuration, the circuit board 472 may be arranged to be adjacent to the front case 401. As a result, when a part where a front surface of the front case 401 is adjacent to a side surface of the front case 401 is formed in a curved surface, the curved surface may have a larger curvature. Since the circuit board 472 is arranged to be adjacent to the front case 401, a spacing distance between the antenna 410 and the circuit board 472 may be increased. This may enhance a transmission and reception function of the antenna 410.

Figure 9:
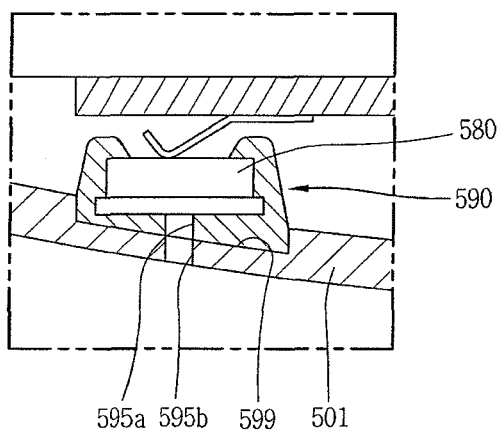
FIG. 9 is a partial sectional view of a mobile terminal according to another exemplary embodiment of the present disclosure.

FIG. 9 is a partial sectional view of a mobile terminal according to still another exemplary embodiment of the present disclosure.

Referring to FIG. 9, a mounting portion 590 is formed of a different material from a case 501. A recess portion 599 configured to mount the mounting portion 590 therein is formed at the case 501. The recess portion 599 may be recessed from one surface of the case 501, and may mount the mounting portion 590 by a double injection-molding. For example, the mounting portion 590 may be injection-molded by using a metallic pattern where the electronic device 580 has been inserted. Then, the mounting portion 590 to which the electronic device 580 has been coupled is inserted into a metallic pattern, thereby injection-molding the case 501. This may allow the case 501, the mounting portion 590 and the electronic device 580 to be integrally coupled with one another even if they are formed of different materials.

The mounting portion 590 may be formed of a material more flexible than that of the case 501, thereby protecting the electronic device 580 from an external impact applied to the case 501. For example, the electronic device 580 may be implemented as a vibrator, and the mounting portion 590 may attenuate a vibration generated from the vibrator. By properly combining a size of the vibration, a thickness of the mounting portion, and the like, the mobile terminal may implement vibration feeling different from that of the conventional mobile terminal.

As another example, the electronic device 580 may be implemented as a microphone, a receiver, or a speaker. In this case, the mounting portion 590 and the case 501 may be provided with through holes 595a and 595b at positions corresponding to each other so that sound is transmitted to the outside or received from the outside.

A boss portion of a metallic pattern corresponding to the through hole 595b of the case 501 when injection-molding the case 501 may be inserted into the through hole 595a of the mounting portion 590. That is, the mounting portion 590 where the electronic device 580 has been mounted may be inserted into a metallic pattern of the case more easily.

In the present disclosure, the electronic device is mounted to the case and is elastically connected to the connection terminal of the circuit board. This may provide a more stable structure than in the conventional art where the electronic device is directly mounted to the circuit board. Furthermore, electric connection between the circuit board and the electronic device may be stably maintained even under an external impact.

Since the electronic device is mounted to the case, a component mounting area of the circuit board may be reduced. This may provide a mobile terminal having a more compact structure.

Furthermore, in the present disclosure, the microphone, the receiver or the speaker are integrally coupled to the case. This may require no additional sealing structure and may enhance input and output functions of sound.

The foregoing exemplary embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

What is claimed is:

1. A mobile terminal comprising:
a case defining a body of the mobile terminal;
a circuit board located in the body;
a camera located in the body;
an electronic device located in the body;
a mounting portion formed at the case so as to mount the electronic device to the case; and
a connection terminal provided at the circuit board, the connection terminal providing an elastic contact between the circuit board and the electronic device, the electronic device being electrically connected to the circuit board via the connection terminal,
wherein the mounting portion includes:
　a protrusion protruding from the case, the protrusion defining an accommodation chamber, the electronic device being located in the accommodation chamber; and
　a cover formed at one end of the protrusion, the protrusion being configured to cover at least a portion of the electronic device,
wherein a resonance space is defined between the circuit board, the electronic device, the camera and the case, and
wherein the mounting portion is disposed between a side surface of the case and a through hole of the case for the camera, and the circuit board is overlapped with the electronic device and the camera.

2. The mobile terminal of claim 1, wherein the electronic device is one of a microphone, a receiver, and a speaker, and wherein a through hole extends between an outer surface of the case and a bottom surface of the accommodation chamber such that sound is transmitted therethrough.

3. The mobile terminal of claim 1, wherein the protrusion is integrally formed with the cover, and the protrusion is formed of the same material as the cover.

4. The mobile terminal of claim 1, wherein the electronic device is arranged so as to directly contact a bottom surface of the accommodation chamber.

5. The mobile terminal of claim 1, wherein a boundary surface is formed between the mounting portion and the electronic device by melting a portion of the case adjacent the electronic device.

6. The mobile terminal of claim 1, wherein the mounting portion is formed of a different material from the case, and
wherein the case includes a recess portion formed on one surface of the case to receive the mounting portion.

7. The mobile terminal of claim 6, wherein the electronic device is one of a microphone, a receiver, and a speaker, and
wherein the mounting portion and the case are provided with through holes at positions corresponding to each other.

8. The mobile terminal of claim 1, further comprising an impact attenuation member configured to surround the mounting portion and the electronic device so as to protect the electronic device from an external impact.

9. The mobile terminal of claim 1, wherein the electronic device includes:
a first electrode terminal disposed on one surface of the electronic device; and
a second electrode terminal disposed on the one surface of the electronic device and surrounding the first electrode terminal, the second electrode terminal having a different polarity from the first electrode terminal,
wherein the connection terminal includes:
　a first connection terminal part contacting the first electrode terminal; and a second connection terminal part contacting the second electrode terminals, and wherein the connection terminal is configured to supply power to the electronic device.

10. The mobile terminal of claim 9, wherein the first electrode terminal is formed in a circular shape, the second electrode terminal is formed in a ring shape, and the first electrode terminal being located within the ring-shaped second electrode terminal.

11. The mobile terminal of claim 10, wherein the first and second connection terminal parts are arranged so as to be spaced from each other in a radial direction of the ring-shaped second electrode terminal.

12. The mobile terminal of claim 10, wherein each of the first and second connection terminal parts is provided with a fixed end surface-mounted to the circuit board and a free end elastically contacting the first and second electrode terminals, respectively.

13. The mobile terminal of claim 1, wherein the case includes a front case having a window, and wherein the electronic device is mounted to a front inner surface or a side inner surface of the front case.

14. The mobile terminal of claim 13, wherein at least a part of the front case is formed to have a curved surface and the electronic device is mounted at an inner side of the curved surface.

15. The mobile terminal of claim 13, wherein the case includes a rear case, the combination of the front and rear cases defining an inner space, and wherein an antenna is disposed between the circuit board and the rear case in the inner space.

16. A mobile terminal, comprising:
a case defining a body of the mobile terminal;
a circuit board located in the body;
a camera located in the body;
an electronic device located in the body, the electronic device being spaced from the circuit board;
a mounting portion integrally formed with the case, the mounting portion surrounding the electronic device such that the electronic device is fixed to the case; and
a connection terminal surface-mounted on the circuit board and extending toward the electronic device so as to contact the electronic device,
wherein the mounting portion includes:
a protrusion protruding from the case, the protrusion defining an accommodation chamber, the electronic device being located in the accommodation chamber; and
a cover formed at one end of the protrusion, the protrusion being configured to cover at least a portion of the electronic device,
wherein a resonance space is defined between the circuit board, the electronic device, the camera and the case, and
wherein the mounting portion is disposed between a side surface of the case and a through hole of the case for the camera, and the circuit board is overlapped with the electronic device and the camera.

17. The mobile terminal of claim 16, wherein a boundary surface is formed between the mounting portion and the electronic device by melting a portion of the case adjacent the electronic device.

* * * * *